(12) United States Patent
Martins

(10) Patent No.: US 7,209,005 B2
(45) Date of Patent: Apr. 24, 2007

(54) CLASS-AB AMPLIFIER FOR DUAL VOLTAGE SUPPLIES

(75) Inventor: Marcus Marchesi Martins, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 28 days.

(21) Appl. No.: 10/812,530

(22) Filed: Mar. 30, 2004

(65) Prior Publication Data

US 2005/0218982 A1    Oct. 6, 2005

(51) Int. Cl.
*H03F 3/45* (2006.01)
(52) U.S. Cl. .................. 330/255; 330/253; 330/257
(58) Field of Classification Search ............. 330/174, 330/253, 255, 257
See application file for complete search history.

(56) References Cited

U.S. PATENT DOCUMENTS

| | | | | |
|---|---|---|---|---|
| 5,900,780 A | * | 5/1999 | Hirose et al. | 330/253 |
| 6,246,152 B1 | * | 6/2001 | Fontanella et al. | 310/317 |
| 6,317,000 B1 | * | 11/2001 | Ivanov et al. | 330/255 |
| 6,433,637 B1 | * | 8/2002 | Sauer | 330/255 |
| 6,617,758 B2 | * | 9/2003 | Murphy et al. | 310/323.01 |

* cited by examiner

*Primary Examiner*—Khanh Van Nguyen
(74) *Attorney, Agent, or Firm*—Turn B. Thach; W. James Brady, III; Frederick J. Telecky, Jr.

(57) ABSTRACT

An amplifier providing a drive signal indicative of a data input signal to a capacitive and/or resistive type load, the amplifier having a first transistor circuit adapted for converting the data input signal to a corresponding current signal in which the transistors of the first transistor circuit operate at a first voltage and having a second transistor circuit amplifying the current signal in which the transistors of the second transistor circuit operate at a second voltage. The first transistor circuit and the second transistor circuit are integrated for providing a class AB operable current output to the load.

18 Claims, 5 Drawing Sheets

CLASS-AB AMPLIFIER FOR DUAL VOLTAGE SUPPLIES

FIELD OF THE INVENTION

The present invention relates generally to electronic circuits and, more particularly, to amplifier circuits suitable for fabrication as part of an integrated circuit for providing high voltage and current outputs.

BACKGROUND OF THE INVENTION

It is often desired to provide a relatively high drive signals to control certain types of devices, for example a hard disk drive head actuator. In the state of the art electronic circuits utilized to move reading and writing heads in disk memory system a voice coil motor is widely used as an actuator to move and position the reading and writing heads. Recently, so-called milli-motors, or milli-actuators, have been considered to provide better, or more accurate, position control of the head. A milli-actuator is generally constructed with a piezo element carried by the positionable arm and to which the head is mounted. A current is selectively applied to the piezo element, which causes the piezo element to deflect, thereby moving the head a small, controllable amount. This provides a fine adjustment to the position of the head. As track densities become more dense, control of the position of the head becomes more critical. Thus, piezo-based milli-actuators are becoming of increasing importance in the head positioning mechanisms.

Although such control circuits are relatively easy to build, they have several problems. Firstly, relatively high drive signals, for example those used to operate piezo elements, may require relatively large circuit components which complicate the overall circuit design and may limit integration. Secondly, most systems are require to be linear, in the disk drive example, an amount the piezo element deflects should be directly proportional to the value of the current applied.

Previously developed amplifier output circuits have addressed some of these problems. For example, output circuits commonly referred to as class A circuits provide low output distortion. Unfortunately, class A circuits inherently consume large amounts of quiescent current. A second class of output circuits is referred to as class B circuits. These circuits consume very little quiescent current. However, class B circuits exhibit substantial crossover distortion. A hybrid of the class A and Class B output circuits is commonly referred to as class AB output circuits. Class AB circuits consume less quiescent current than equivalent class A circuits and they exhibit less crossover distortion than class B circuits. Ideally, a high-performance actuator circuit should be provided in integrated circuit form, and should feature rail-to-rail outputs that impart the maximum voltage with an output stage which minimize cross-over distortion without consuming large amounts of quiescent current. Further, these circuit must include not only high voltage circuitry but also circuitry for use in low voltage input applications. Conventional approaches would use separate stages or dedicated circuitries which adds circuit complexity and/or circuit size.

What is needed is a solution for those applications which require an amplifier with an output stage that operates in class AB and delivers high output voltages and currents in which the inputs stage and output stage are coupled to different supply voltages and which require an efficient silicon area.

SUMMARY

The present invention achieves technical advantages as an apparatus and system which couples a low voltage input stage with the high voltage output which at the same time sets an class AB output current. In one embodiment, an amplifier provides a drive signal indicative of a data input signal to a capacitive and/or resistive type load, the amplifier having a first transistor circuit adapted for converting the data input signal to a corresponding current signal in which the transistors of the first transistor circuit operate at a low voltage and having a second transistor circuit amplifying the current signal in which the transistors of the second transistor circuit operate at a high voltage. The first transistor circuit and the second transistor circuit are integrated for providing a class AB operable current.

In another embodiment an amplifier circuit provides drive signals, responsive to data signals, to a piezo element provided for positioning a head in a mass data storage device having a first circuit having components operated at a first voltage and adapted for providing a current signal indicative of the data signals and having a second circuit coupled with the first circuit and having components operated at a second voltage for providing a drive signal to the piezo element in which the first circuit and the second circuit are cooperable for providing a class AB drive current to the piezo element.

BRIEF DESCRIPTION OF THE DRAWINGS

For a more complete understanding of the present invention, reference is made to the following detailed description taken in conjunction with the accompanying drawings wherein.

DETAILED DESCRIPTION

Figure 1:
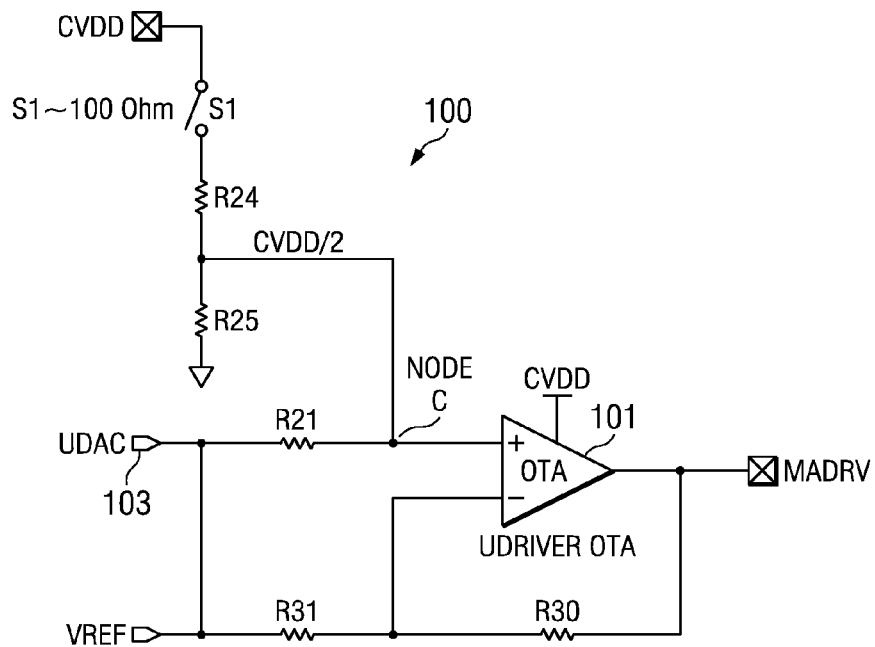
FIG. 1 shows a driver circuit in accordance with exemplary embodiments of the present invention.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

FIG. 1 shows a drive block diagram illustrating an overall structure of a milli-actuator which includes an operational transconductance amplifier (OTA) 101 to provide driving output signals to control an associated piezo element, for example, or some other capacitive type load. One input to the OTA 101 is from a micro digital-to-analog converter 103 and the other is from a reference voltage $V_{REF}$. The DAC 103 receives a data signal input and converts it to some voltage and which together with the $V_{REF}$ input drives the OTA 101. Feedback resistors R30 and R31 establish a feedback such that the input to the OTA 101 controls the output such that the output tracks the input with a voltage gain of 9, established by the ratio of R30/R31. The drive circuit 100 further includes a voltage conversion circuit comprising voltage source CVDD (which also supplies the OTA 101) and resistors R24 and R25 coupled to supply CVDD/2 to node C, this circuit provides a referencing to the high voltage output supply CVDD.

The DAC 103 is an output of $V_{DAC}$ Plus $V_{REF}$, a voltage that corresponds to a binary word plus a reference. So with this differential configuration, $V_{REF}$ is basically subtracted out leaving $V_{DAC}$ and CVDD/2 is combined for relating it to the output supply CVDD.

The S1 switch provides an enable function to prevent current bleeding from the CVDD power supply when the OTA 101 is not in use. This is particularly important in those applications where CVDD sometimes needs to be in a very low current state. Thus, the OTA 101 can be disabled and the DAC 103 will be connected to the output MADRV can continued to be used for other applications.

Figure 4A:
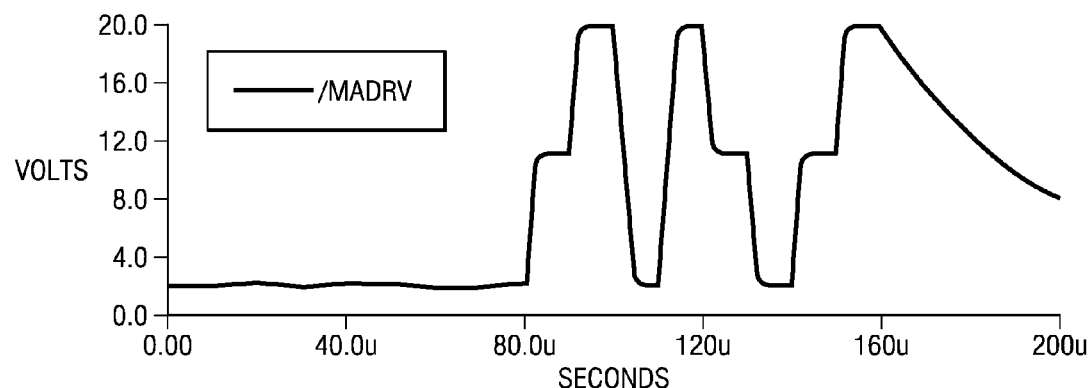
FIGS. 4A and 4B are graphical illustrations of a transient response of an amplifier in accordance with exemplary embodiments of the present invention.
Figure 4B:
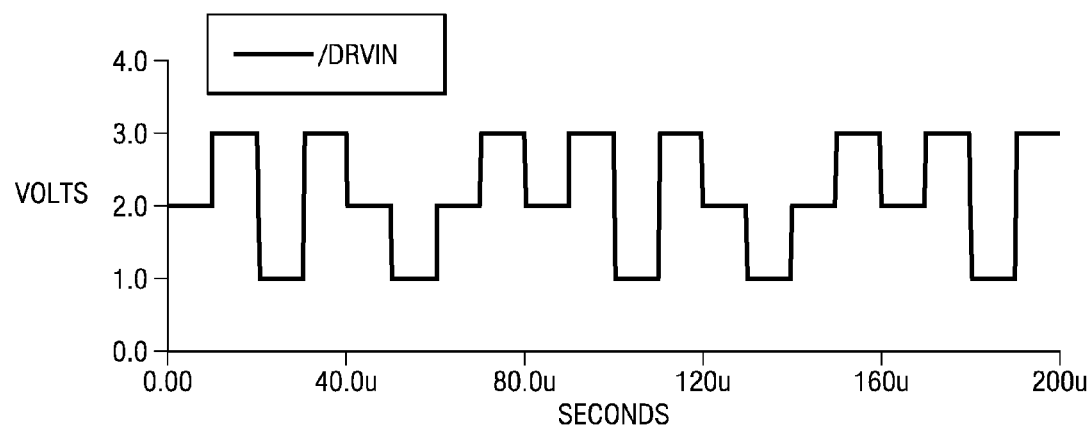

More specifically, the DAC 103 output is $V_{DAC}$ plus $V_{REF}$ where $V_{REF}$ is chosen at two volts and $V_{DAC}$ is from plus or minus one volt, as shown in FIG. 4B. The output of the OTA 101 is $V_{DAC}$ with a gain of nine plus half of CVDD. The transient response with a CVDD of approximately 22 volts is illustrated in FIG. 4A. From 0 to 80 us is the period where the DAC is selected as the output and, since the capacitor is still connected at the output, the signal DRVIN is filtered down which shows as a substantially flat voltage.

Figure 2:
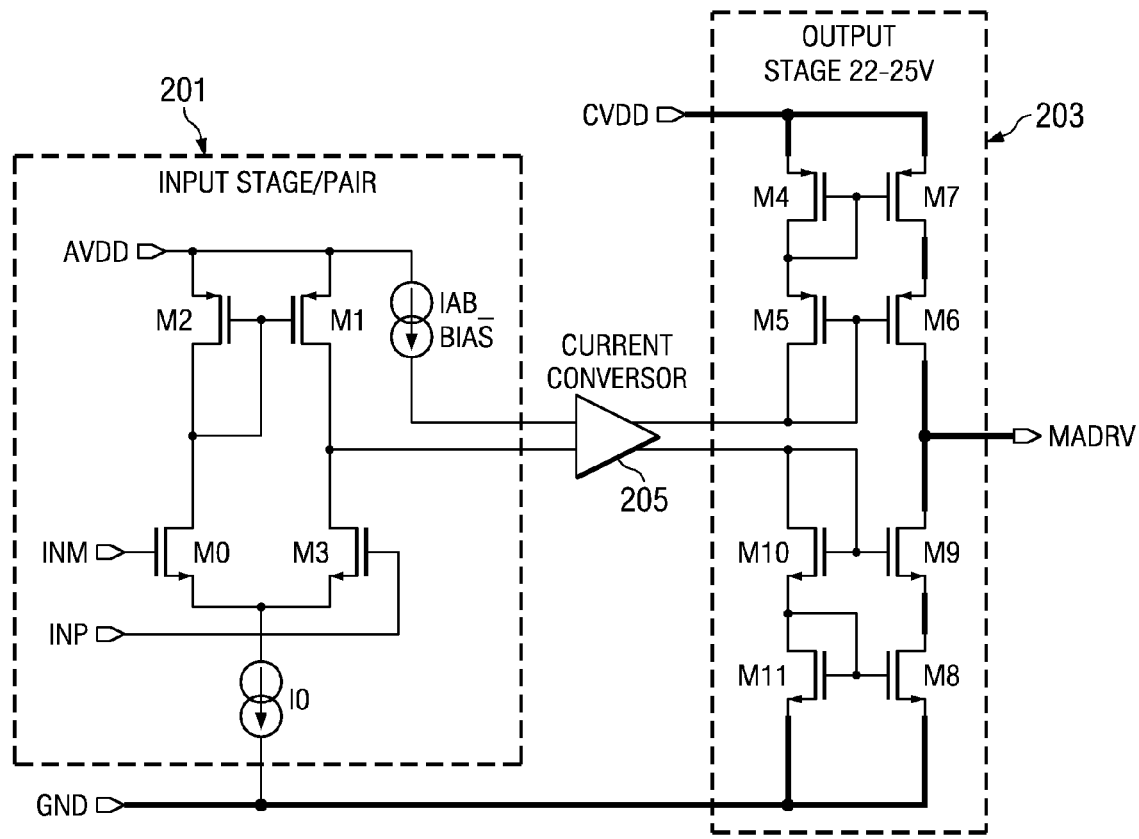
FIG. 2 shows a circuit diagram of an amplifier which can be used for the OTA illustrated in FIG. 1 in accordance with exemplary embodiments of the present invention.

Referring now to FIG. 2 there is shown a diagram of a circuit which can be used for the OTA illustrated in FIG. 1 in accordance with exemplary embodiments of the present invention in which class AB current generation is integrated via an interface between low voltage input and high voltage output stages such that the input stage and output stage are integral for generating the class AB current, and such is suitable for applications where input and output stages are connected to different voltage supplies. Shown at item 201 is the input stage portion (which connects to the DAC 103 and the $V_{REF}$ input) and shown at item 203 is the output stage portion and coupled therebetween is a current conversor 205. The input stage 201 operates at a lower voltage than does the output stage 203, for example here AVDD is approximately 5 volts and CVDD is approximately 22–25 volts. The input stage 201 operates at low voltage, 5 volts, so low voltage transistors are used and the output stage operates at 22–25 volts so high voltage transistors are used. The current conversor 205 effects a coupling and/or transition of the input 201 and the output 203 effectively integrating a class AB current generation. The current conversor works as an "adaptor" between the input and output stages, injecting the current coming from the output of the first stage into the input of the output stage. At the same time the Current Conversor sets the class AB current at the output node each time the voltages on INM and INP are equal (zero voltage across INM and INP). The Current Conversor receives the reference current IAB_BIAS generated in the low voltage input stage and forces a similar magnitude current (or an amplified version of it) through M4 and M11 which is then amplified by the channel width/length ratio of M7/M4 and M8/M11 to a higher current (class AB current) at the output node.

Thus, an amplifier is provided in which a current conversor 205 couples a low voltage input stage with the high voltage output stage which, at the same time, set the class AB output current.

Figure 3:
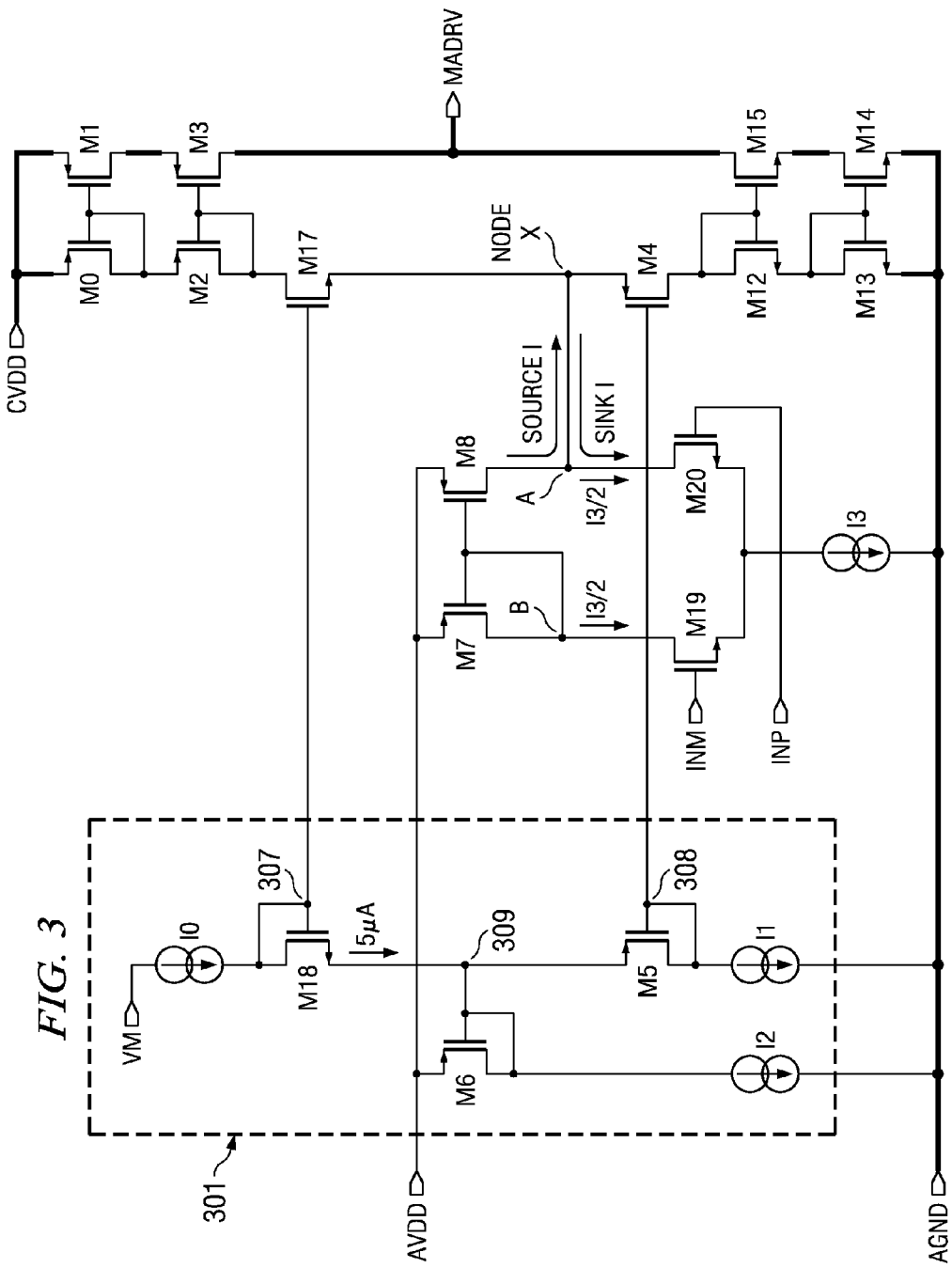
FIG. 3 is a circuit diagram showing further details of the amplifier shown in FIG. 2 in accordance with exemplary embodiments of the present invention.

Referring now to FIG. 3 there is shown further details of the link between the input stage and the output stage for setting the class AB output current. As is known, the class AB current is the current at the output stage when the input is zero (when zero voltage is applied across INM and INP). In this embodiment, the class AB current is targeted for approximately 250 microamps. Comparing with FIG. 2, it is seen that circuit portion 301 is added and transistors M17 and M4 are added which are cooperable to conduct current in the first branch of the output circuit. In operation with some voltage applied to VM and as an input voltage is received at INM and INP, some current sinking or sourcing is forced at node X such that it follows the input signal.

Transistors M6, M7 and M8 and currents I2 and I3 are properly sized such that the voltage at drain of M6 is approximately the same at node A (the drain of M8) and node B (the drain of M7) and the same amplification when zero voltages is applied across the inputs NM and INP. Here, M6 is selected to be $\frac{1}{12}^{th}$ of M7 and M8 (channel width/channel length of M6 is $\frac{1}{12}^{th}$ of channel width/channel length of M7 and M8), I2 is 25 microamps and I3 is 600 microamps.

Further, current is forced from the VM rail, the VM rail could be the CVDD rail. In the present embodiment, 5 microamps are forced through M18 and M5 such that no current is flowing between the meet point 309 between M18 and M5 and the drain node of M6 preventing interference or change in the voltage of the M6 drain node. This is done to generate a VGS voltage above point 309 (which is point 307) and below point 309 (which is point 308) for biasing M17 and M4, respectively. Transistor M18 matches M17 and transistor M5 matches M4 such that, when 5 microamps occurs through M5 and M18, 5 microamps is flowing through M17 and M4, so 5 microamps is flowing through the first branch of the output circuit As can be seen, this current is mirrored to the last branch of the output circuit 50 times giving a class AB current of 250 microamps with zero voltage across the inputs.

As a voltage input signal is applied, some current is sourced/sinked to the output circuit through node X. That is, current is sourced from M8 into the output stage or current is sinked through M20. The amount of current for source/sink depends of the tail current and in this case 600 microamps. Thus, a most unbalance input (if the inputs are railed) eventually forces the entire current to the output stage. For the situation where INP is much higher than INM, all 600 microamps is flowing through M20, so it is sinking from the output stage forcing 600 microamps through M17 from the CVDD rail. This 600 microamps in the first branch of the output circuit is mirrored 50 times between MO and M1 to the last branch of the output circuit. That is 30 milliamps to the load. Similarly, when INM is much higher than INP, the 600 microamp current is flowing through M19 which is mirrored between M7 and M8 and 600 microamps is sourced to the first branch of the output circuit. That current then flows through M4, M12, and M13 and is mirrored 50 times down between M13 and M14 also giving 30 milliamps to the last branch of the output circuit.

Figure 5A:
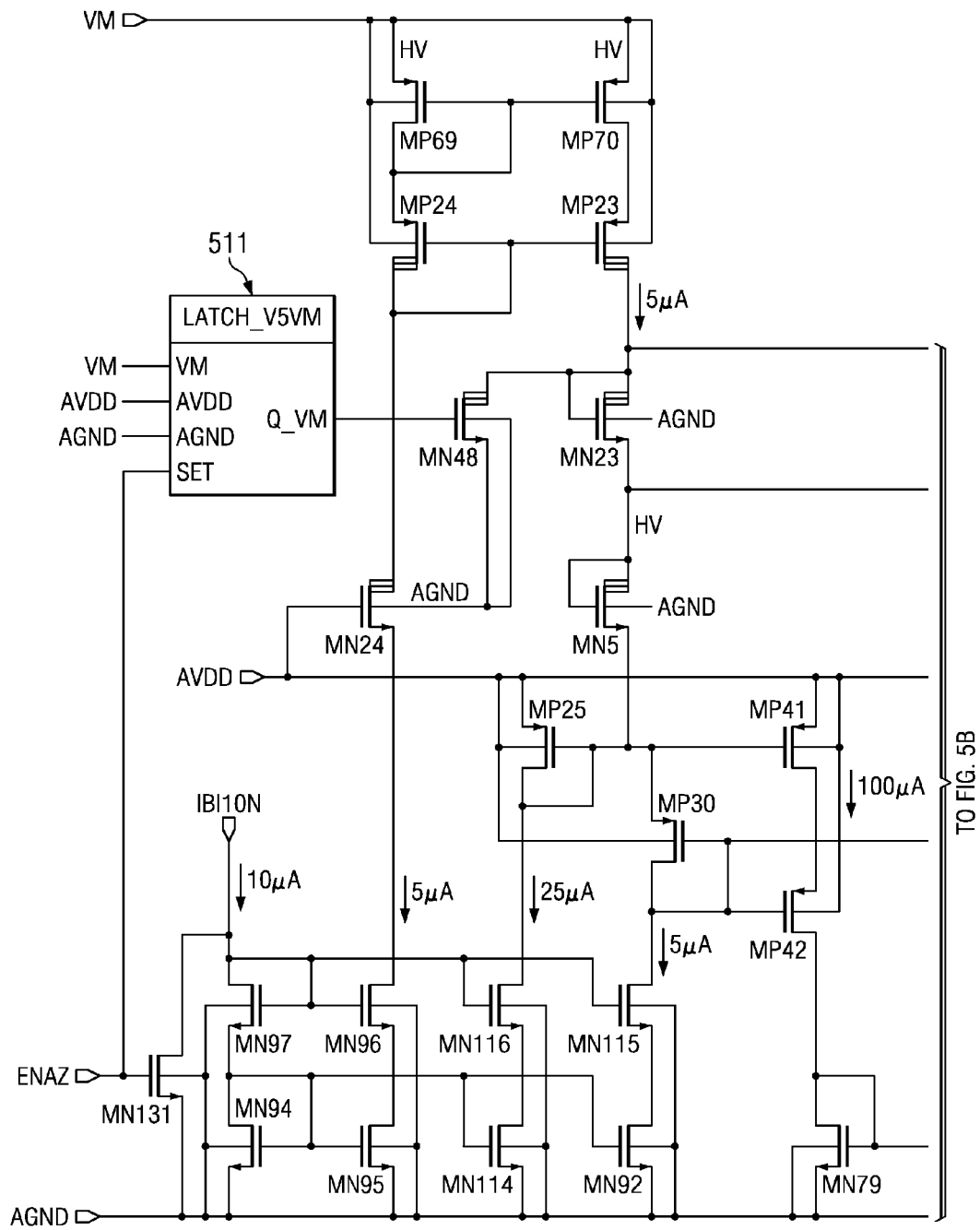
FIG. 5 is an electrical schematic showing further details of the circuit shown in FIG. 3 in accordance with exemplary embodiments of the present invention.
Figure 5B:
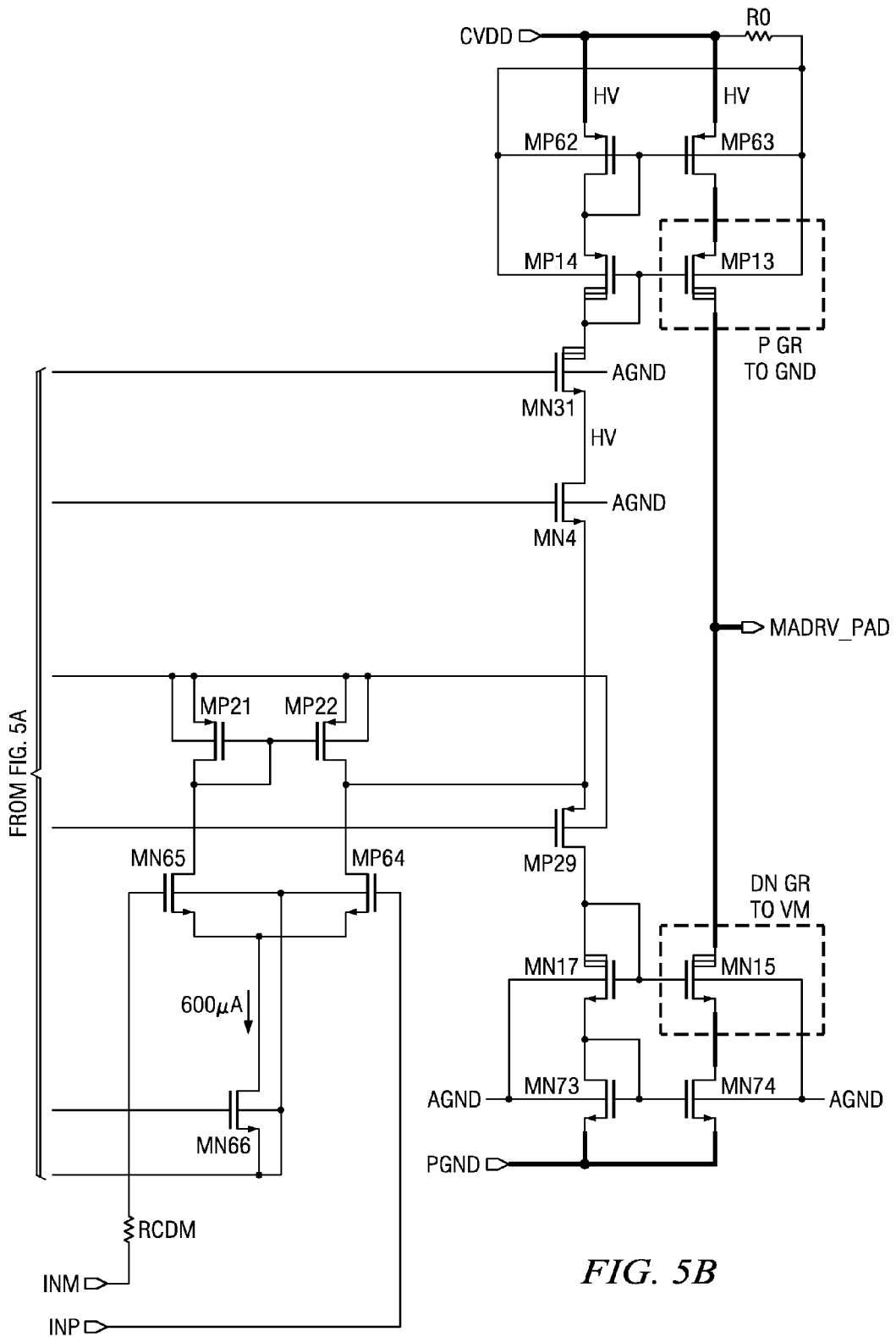

With reference now additionally to FIG. 5, a more detailed schematic of the OTA 101 is shown. As mentioned, the OTA 101 is operated in class AB mode. Here, the input stage is basically MOS devices MN65 and MN64 and the load to the first branch of the output stage being MP21 and MP22 with the tail current provided by MN66 and MN79. As can be seen, MP29 plays the role of M4 of FIG. 3 and MN4 plays the role of M17. Another transistor, MN31, has been added in cascode with MN4 for improving matching between MN4 and MN5 for providing the VGS of MN4 to be that of MN5. Thus, when MN31 and MN23 are added, a better match is created. Input current is provided at IBI10N and current mirrors are provided for generating the branch currents and the 600 microamp tail current. A minimum of current mirrors are used providing compactness (i.e., small silicon area).

The latch block 511, high voltage transistor MN48, and low voltage transistor MN131 provide disablement of the OTA circuit. As can be seen, signaling from the ENAZ input eliminates the bias of the circuitry which disables the output stage. It should be noted that in this implementation, the high voltage transistors are shown as drain extended devices. MN24, MP24 and MN96 provide a transition between the high and low voltages. For this particular application, the VM rail is preferably 12 volts and CVDD is 24 volts or two times VM in which VDD is five volts.

In conclusion, an amplifier is provided for generation of class AB current in combination with two circuit stages operating in a first and second voltage supply. Though described in terms of use in a HDD application, the amplifier can also be used, for example, for driving other types of capacitive loads as well as resistive loads. Although exemplary embodiments of the invention are described above in detail, this does not limit the scope of the invention, which can be practiced in a variety of embodiments.

What is claimed is:

1. An amplifier circuit for providing drive signals to a load, comprising:
    an input for receiving data signals;
    a first circuit operable with a first supply rail coupled with said input and having components operated at a first voltage and said first circuit adapted for providing a current signal indicative of said data signals; and
    a second circuit operable with a second supply rail coupled with said first circuit and having components operated at a second voltage for providing a drive signal to said load;
    wherein said first circuit and said second circuit are cooperable for providing a class AB drive current to said load; and
    wherein said second circuit further includes a mirror circuit for mirroring said current signal provided by said first circuit at a predetermined mirror ratio for providing said drive current.

2. The amplifier of claim 1, wherein said predetermined mirror ratio is fifty to one.

3. The amplifier of claim 1, wherein said second voltage is approximately 4–5 times that of said first voltage.

4. The amplifier of claim 1 wherein said first circuit comprises transistors operable from a supply rail providing approximately five volts and said second circuit comprises transistors operable from a supply rail providing a voltage in range of 22 volts to 25 volts.

5. The amplifier of claim 1, wherein said drive signal has a current of approximately 250 micro amperes in the steady state condition.

6. The amplifier of claim 1, wherein said input is a differential input for receiving a digital-to-analog converted data signal and a reference signal.

7. The amplifier of claim 1, wherein said input, said first circuit, and said second circuit are integrated on a semiconductor chip.

8. An amplifier circuit for providing drive signals to a load, comprising:
    an input for receiving data signals;
    a first circuit operable with a first supply rail coupled with said input and having components operated at a first voltage and said first circuit adapted for providing a current signal indicative of said data signals; and
    a second circuit operable with a second supply rail coupled with said first circuit and having components operated at a second voltage for providing a drive signal to said load;
    wherein said second circuit includes a first branch for receiving from said first circuit a source/sink current indicative of said data signals and a second branch for outputting said drive signal to said load, wherein said drive signal current is a predetermined ratio of said source/sink current.

9. An amplifier circuit for providing drive signals to a piezo element provided for positioning a head in a mass data storage device, comprising:
    an input for receiving data signals indicative of head positioning;
    a first circuit operable with a first supply rail coupled with said input and having components operated at a first voltage and said first circuit adapted for providing a current signal indicative of said data signals; and
    a second circuit operable with a second supply rail coupled with said first circuit and having components operated at a second voltage for providing a drive signal to said piezo element;
    wherein said first circuit and said second circuit are cooperable for providing a class AB drive current to said piezo element; and
    wherein said second circuit further includes a mirror circuit for mirroring said current signal provided by said first circuit at a predetermined mirror ratio for providing said drive current.

10. The amplifier of claim 9, wherein said predetermined mirror ratio is fifty to one.

11. The amplifier of claim 9, wherein said second voltage is approximately 4–5 times that of said first voltage.

12. The amplifier of claim 9, wherein said first circuit comprises transistors operable from a supply rail providing approximately five volts and said second circuit comprises transistors operable from a supply rail providing a voltage in range of 22 volts to 25 volts.

13. The amplifier of claim 9, wherein said drive signal has a current of approximately 250 micro amperes in the steady state condition.

14. The amplifier of claim 9, wherein said input is a differential input for receiving a digital-to-analog converted data signal and a reference signal.

15. The amplifier of claim 9, wherein said input, said first circuit, and said second circuit are integrated on a semiconductor chip.

16. An amplifier circuit for providing drive signals to a piezo element provided for positioning a head in a mass data storage device, comprising:
    an input for receiving data signals indicative of head positioning;
    a first circuit coupled with said input and having components operated at a first voltage and said first circuit adapted for providing a current signal indicative of said data signals; and a second circuit coupled with said first circuit and having components operated at a second voltage for providing a drive signal to said piezo element, wherein said first circuit and said second circuit are cooperable for providing a class AB drive current to said piezo element;

wherein said second circuit includes a first branch for receiving from said first circuit a source/sink current indicative of said data signals and a second branch for outputting said drive signal to said piezo element, wherein said drive signal current is a predetermined ratio of said source/sink current.

17. An amplifier on a semiconductor chip for providing a drive signal indicative of a data input signal to a capacitive load, said amplifier comprising:

an input for receiving said data input signal;

a first transistor circuit operable with a first supply rail coupled to said input and adapted for converting said data input signal to a corresponding current signal, said first transistor circuit is further couplable to a first supply rail for receiving a first voltage for operating transistors therein;

a second transistor circuit operable with a second supply rail coupled to said first transistor circuit for receiving said current signal and adapted to amplify the magnitude thereof, said second transistor circuit is further couplable to a second supply rail for receiving a second voltage for operating transistors therein and further including a mirror circuit for mirroring said current signal provided by said first transistor circuit at a predetermined mirror ratio for providing said drive current;

wherein said first transistor circuit and said second transistor circuit are integrated for providing a class AB operable current; and wherein said second transistor circuit further includes a mirror circuit for mirroring said current signal provided by said first transistor circuit at a predetermined mirror ratio for providing said AB operable current; and an output coupled to said second transistor circuit for outputting said class AB operable current to said capacitive load.

18. The amplifier of claim 17, wherein said first voltage is in a range of approximately five volts and said second voltage is in a range of approximately 24 volts.

* * * * *